US 6,745,376 B2

(12) United States Patent
Fredrickson

(10) Patent No.: US 6,745,376 B2
(45) Date of Patent: Jun. 1, 2004

(54) SEVERAL IMPROVEMENTS FOR TIMING DIAGRAMS

(75) Inventor: Mark S. Fredrickson, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 256 days.

(21) Appl. No.: 09/954,813

(22) Filed: Sep. 17, 2001

(65) Prior Publication Data

US 2003/0052880 A1 Mar. 20, 2003

(51) Int. Cl.[7] .................................................. G06F 9/45

(52) U.S. Cl. ..................... 716/6; 716/4; 716/5; 716/6; 716/10

(58) Field of Search ........................ 716/1, 4, 5, 6, 716/10, 11; 714/724, 41, 33; 703/15, 14; 702/79; 382/100; 348/440.1; 345/769, 440; 340/7.56; 326/96; 713/322

(56) References Cited

U.S. PATENT DOCUMENTS

| 5,210,700 | A | * | 5/1993 | Tom .............................. 716/6 |
| 5,508,937 | A | * | 4/1996 | Abato et al. .................... 716/6 |
| 5,745,386 | A | * | 4/1998 | Wile et al. ..................... 703/15 |
| 5,903,577 | A | * | 5/1999 | Teene .......................... 714/724 |
| 6,005,416 | A | * | 12/1999 | Beakes et al. ................. 326/96 |
| 6,049,883 | A | * | 4/2000 | Tjandrasuwita ............. 713/322 |
| 6,181,320 | B1 | * | 1/2001 | Fredrickson ................. 345/440 |
| 6,442,741 | B1 | * | 8/2002 | Schultz .......................... 716/6 |
| 6,470,482 | B1 | * | 10/2002 | Rostoker et al. ............... 716/6 |

* cited by examiner

Primary Examiner—Vuthe Siek
Assistant Examiner—Helen Rossoshek
(74) Attorney, Agent, or Firm—James R. Nock

(57) ABSTRACT

A method for graphically representing various types of timing relationships between signals in an electronic system. After a static timing analysis is performed on an electronic system, a set of timing waveforms is displayed. The present invention analyzes the timing relationships between the waveforms, then generates and adds a graphical symbol representing the type and characteristics of the timing relationship to the display.

30 Claims, 9 Drawing Sheets

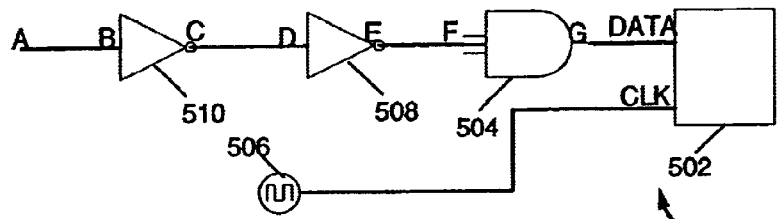
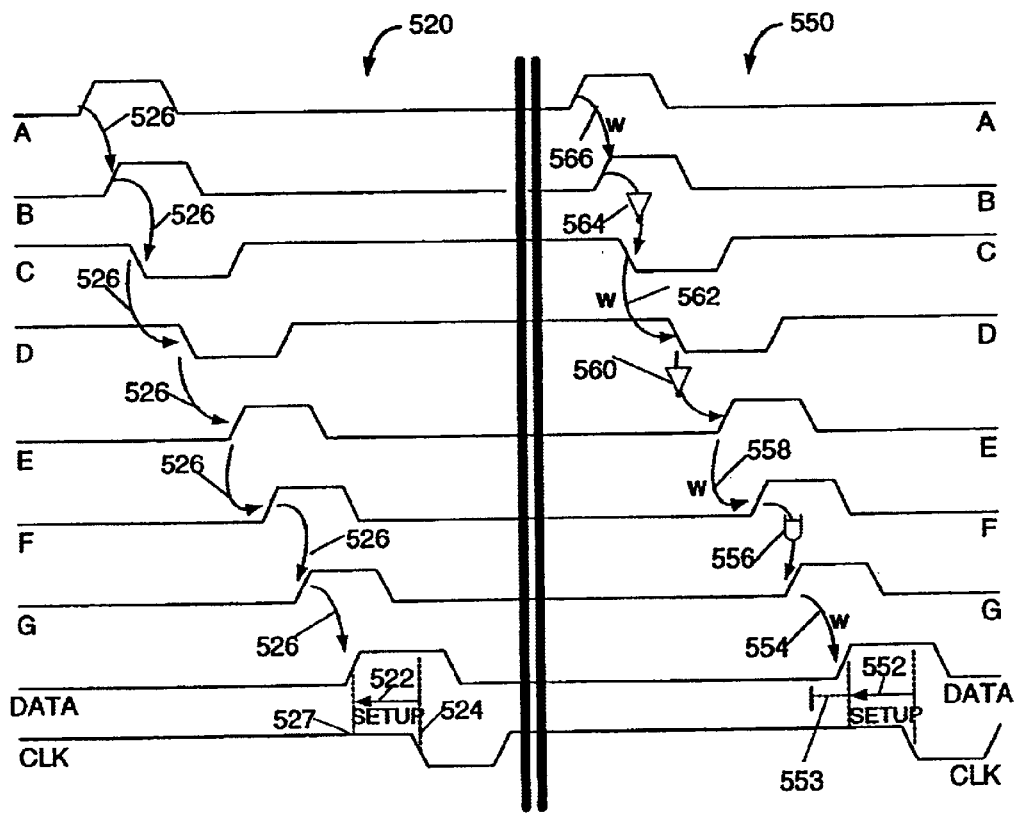
FIGURE 5A
FIGURE 5B
FIGURE 5C

SEVERAL IMPROVEMENTS FOR TIMING DIAGRAMS

FIELD OF THE INVENTION

The present invention relates to a method used to display signals in electronic systems, and more specifically to a method for graphically representing temporal relationships between signals.

BACKGROUND OF THE INVENTION

In today's high performance electronic systems, timing continues to be a top priority. As a result, designers are spending increased effort addressing integrated circuit (IC) performance. Traditionally, dynamic simulators have been utilized to verify the functionality and timing of an entire design or blocks within the design. Dynamic timing simulation requires vectors, a logic simulator and timing information. With this methodology, input vectors are used to exercise functional paths based on dynamic timing behaviors for the chip or block.

The advent of larger designs and huge vector sets make dynamic simulation a serious bottleneck in design flows. Dynamic simulation is becoming more problematic because of the difficulty in creating comprehensive vector sets with high levels of coverage. Time-to-market pressure, chip complexity, limitation in the speed and capacity of traditional simulators all are motivating factors for migration toward static timing techniques.

Static timing analysis (STA) is an exhaustive method of analyzing, debugging and validating the time performance of a design. First, a design is analyzed, then all possible paths are timed and checked against the requirements. Since STA is not based on functional vectors, it is typically very fast and can accommodate very large designs. STA is exhaustive in that every path in the design is checked for timing violations. This is a key advantage over dynamic simulators, which require an impossible number of vectors in order to provide the same level of timing coverage.

STA typically generates several textual reports identifying design paths that do not meet required timing constraints. Design engineers are often forced to look at several different reports to obtain information about the required margin of setup, hold and pulse width relationships, and to determine additional information about the type of a delay relationship.

In order to improve the usability of STA results, timing diagrams have been generated from the STA database/reports via a graphical user interface (GUI) in order to graphically convey various timing relationships that may be of interest to the designer. FIG. 1 illustrates an example of how a setup timing relationship between two signals is graphically represented in a conventional GUI environment. In the illustrated example, a first signal ("DATA", in this example) is required to be valid (i.e., "stable") at a latch for some period of time before a second signal ("CLK", in this example) latches it.

While the graphical representation described above clearly coveys the setup time for the relationship between two signals, it does not convey the required timing margin, or the amount by which the signals either satisfy or violate the timing margin (i.e., the "slack time").

Conventional STA graphical user interfaces may also enable the representation of delay relationships that are commonly drawn in typical timing diagrams. FIG. 2A illustrates a simple "AND" type logic gate as part of a larger logic system. FIG. 2B is a graphical illustration of the delay relationships present as a signal passes from the output of a first stage of the logic system to the inputs of the "AND" gate (the wire delay from "A" to "B"), through the "AND" gate (the gate delay from "B" to "C"), and from the output of the "AND" gate back into a second stage of the logic system (the wire delay from "C" to "D").

While current drawing methods for delay relationships (i.e., such as those shown in FIG. 2B) show clearly that there is a delay between one signal and another signal, they do not convey information about the "type" or "kind" of delay (i.e., the delay from A to B and C to D are "wire" delays, and the delay from B to C is a block type of delay). Present systems also do not display the "characteristics" of the delay (e.g., the margin by which a signal meets or fails to meet a setup/hold timing requirement).

Thus, it is advantageous to improve existing timing diagrams generated to graphically display, by way of appropriate notations and symbols, additional information on the type and characteristics of various delay relationships.

SUMMARY OF THE INVENTION

The present invention provides a method and computer program product which graphically represents various types of timing relationships between signals in an electronic system. A timing analysis is performed on the electronic system, creating a set of timing results. The set of timing results is searched, and a set of timing waveforms meeting the search criteria is displayed. The type and characteristics of the timing relationship between the displayed waveforms is determined, and a graphical symbol representative of the type and characteristics of timing relationship is generated and added to the set of timing waveforms being displayed.

In an exemplary embodiment of the present invention, the timing analysis is a static timing analysis (STA). The present invention accommodates various types of timing relationships, including but not limited to: setup, hold, block delays, inverting delays, non-inverting delays, combinational logic delays, wire delays, rise triggered delays, and fall triggered delays. In one embodiment, the graphical symbols for the setup and hold type relationships include a graphical indication of timing characteristics for the relationships (e.g., the amount of time by which a signal either satisfies or violates the setup/hold time requirement). The present invention also provides an expand/collapse feature which enables a design engineer to select two or more signals on the display to "collapse" into a combinational logic delay symbol. In a similar manner, the design engineer may "expand" the combinational logic delay symbol back into the two or more signals.

These and other advantages and features, which characterize the invention, are set forth in the claims annexed hereto and forming a further part hereof. However, for a better understanding of the invention, and of the advantages and objectives attained though its use, reference should be made to the drawings, and to the accompanying descriptive matter, in which there is described exemplary embodiment of the invention.

BRIEF DESCRIPTION OF THE DRAWINGS

FIG. 5A illustrates a simple electronic circuit.

FIG. 5B (prior art) illustrates a conventional GUI waveform display of a failed setup condition at a latch within the electronic circuit of FIG. 5A.

FIG. 5C illustrates a GUI waveform display of a failed setup condition at a latch within the electronic circuit of FIG. 5A in accordance with the present invention.

DETAILED DESCRIPTION OF THE PREFERRED EMBODIMENTS

Figure 1:
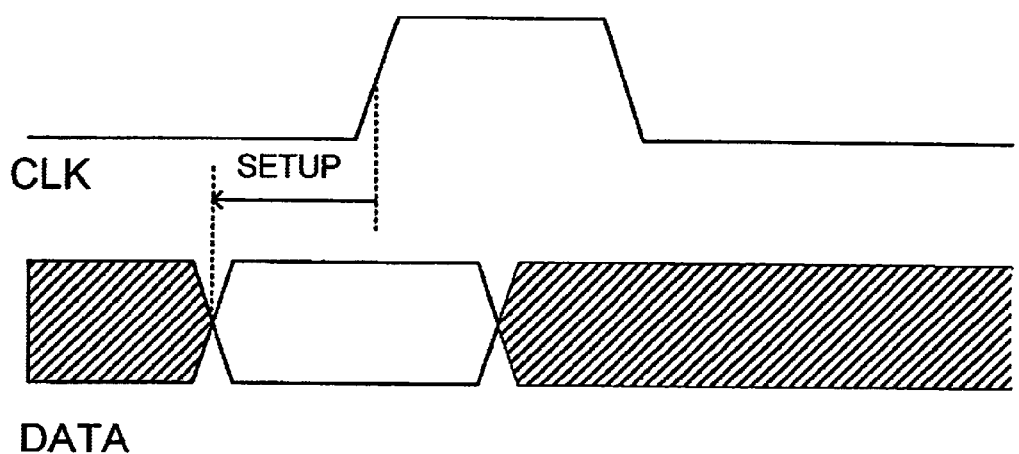
FIG. 1 illustrates an example of how a setup timing relationship between two signals is graphically represented in a conventional graphical user interface (GUI) environment.
Figure 2A:
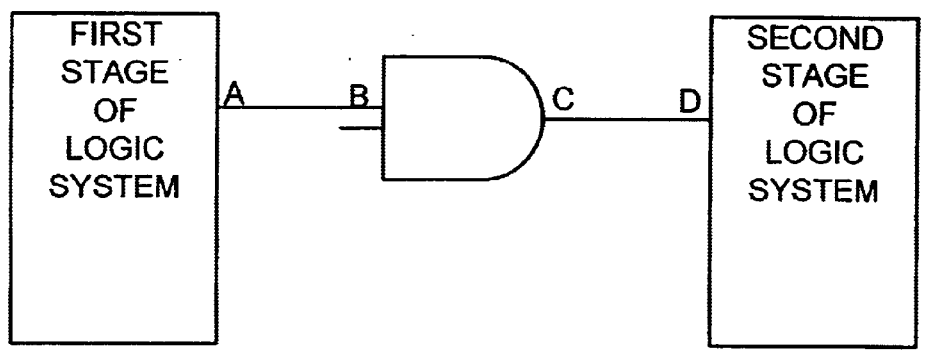
FIG. 2A illustrates a simple "AND" type logic gate as part of a larger logic system.
Figure 2B:
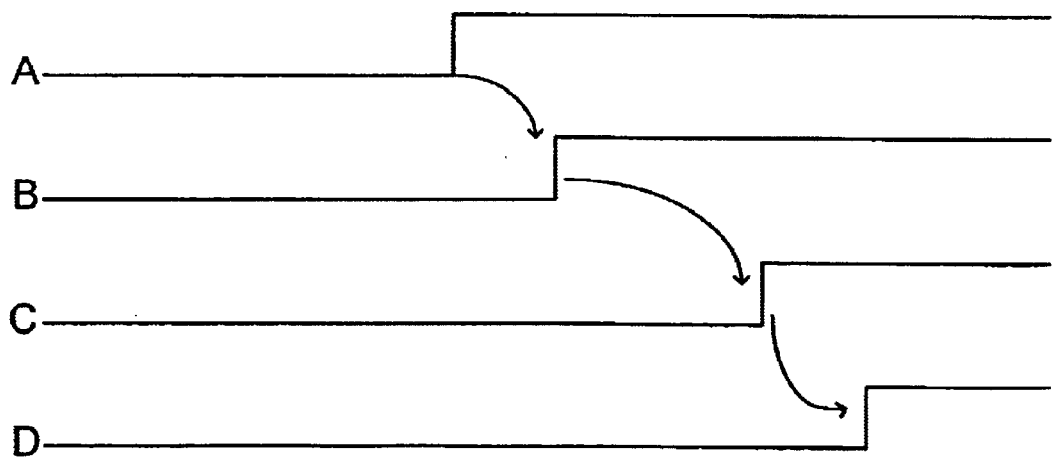
FIG. 2B illustrates the delay components present as a signal passes through the "AND" type logic gate of FIG. 2A.
Figure 3:
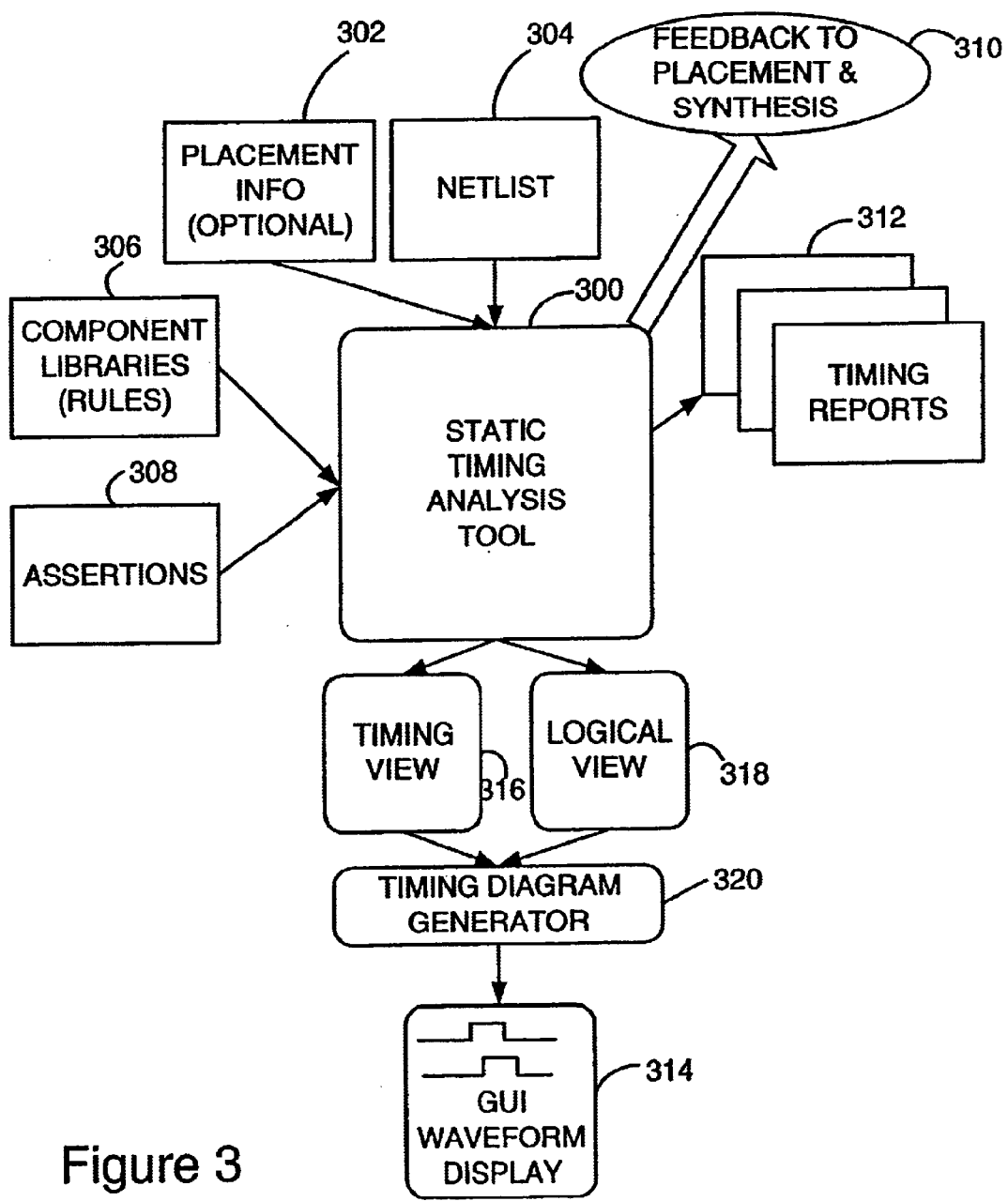
FIG. 3 is a block diagram illustrating one embodiment of a static timing analysis environment in which the present invention may be employed.

Turning to the Drawings, wherein like numbers denote like parts throughout the several views, FIG. 3 is a block diagram illustrating an exemplary embodiment of a timing analysis environment in which the present invention may be employed. The illustrated environment includes a static timing analysis (STA) tool 300 for validating the timing performance of an electronic design. It is contemplated that other types of timing analysis tools may be employed and still remain within the scope of the present invention.

In the illustrated embodiment, static timing analysis tool 300 accepts a number of inputs, including a netlist 304 describing the electrical interconnection of components within the electronic design, optional physical placement information 302 for the components in the design, component libraries (rules) 306 describing the behavioral characteristics of components within the design, and a set of assertions 308 which is a collection of miscellaneous information on the design, such as boundary conditions, arrival times, capacitive loading, and clock definitions (cycle times).

Once provided with the various inputs 302, 304, 306 and 308, static timing analysis tool 300 performs a static timing analysis on the electronic design, generating a timing view database 316 and a logical view database 318 of timing results. Upon completion of the static timing analysis, static timing analysis tool also generates timing reports 312, which provided detailed timing characteristics, in tabular form, of the results of the static timing analysis. Timing reports 312 are used by design engineers to identify timing problems in electronic designs. One example of a timing report is a slack report. A slack report details the temporal amount by which various signals in the electronic design either satisfy or violate a design constraint (e.g., setup or hold time requirement).

The results of a static timing analysis on an electronic design are also typically fed back to placement and synthesis electronic design tools 310, so that these tools may iterate on the electronic design to improve and/or eliminate timing problems in the design.

Finally, STA system can include a timing diagram generator 320 which examines timing results from the timing and logical view databases 316 and 318 and generates timing waveforms at a GUI waveform display 314.

In general, the routines executed to implement the embodiments of the invention, whether implemented as part of an operating system or a specific application, component, program, object, module or sequence of instructions, will be referred to herein as "computer programs", of simply "programs". The computer programs typically comprise one or more instructions that are resident at various times in various memory and storage devices in a computer, and that, when read and executed by one or more processor in a computer, cause that computer to perform the steps necessary to execute steps or elements embodying the various aspects of the invention.

Moreover, while the invention has and hereinafter will be described in the context of fully functioning computers and other programmable electronic devices, those skilled in the art will appreciate that the various embodiments of the invention are capable of being distributed as a program product in a variety of forms, and that the invention applies equally regardless of the particular type of data/signal bearing media used to actually carry out the distribution. Examples of data/signal bearing media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

The STA environment illustrated in FIG. 3 is but one of several possible design environments in which the present invention may be employed. One skilled in the art will recognize that variations in the tools, the set of inputs and outputs provided to the tools, and/or variations in the organization or architecture of databases employed are well within the scope of the present invention.

Figure 4:
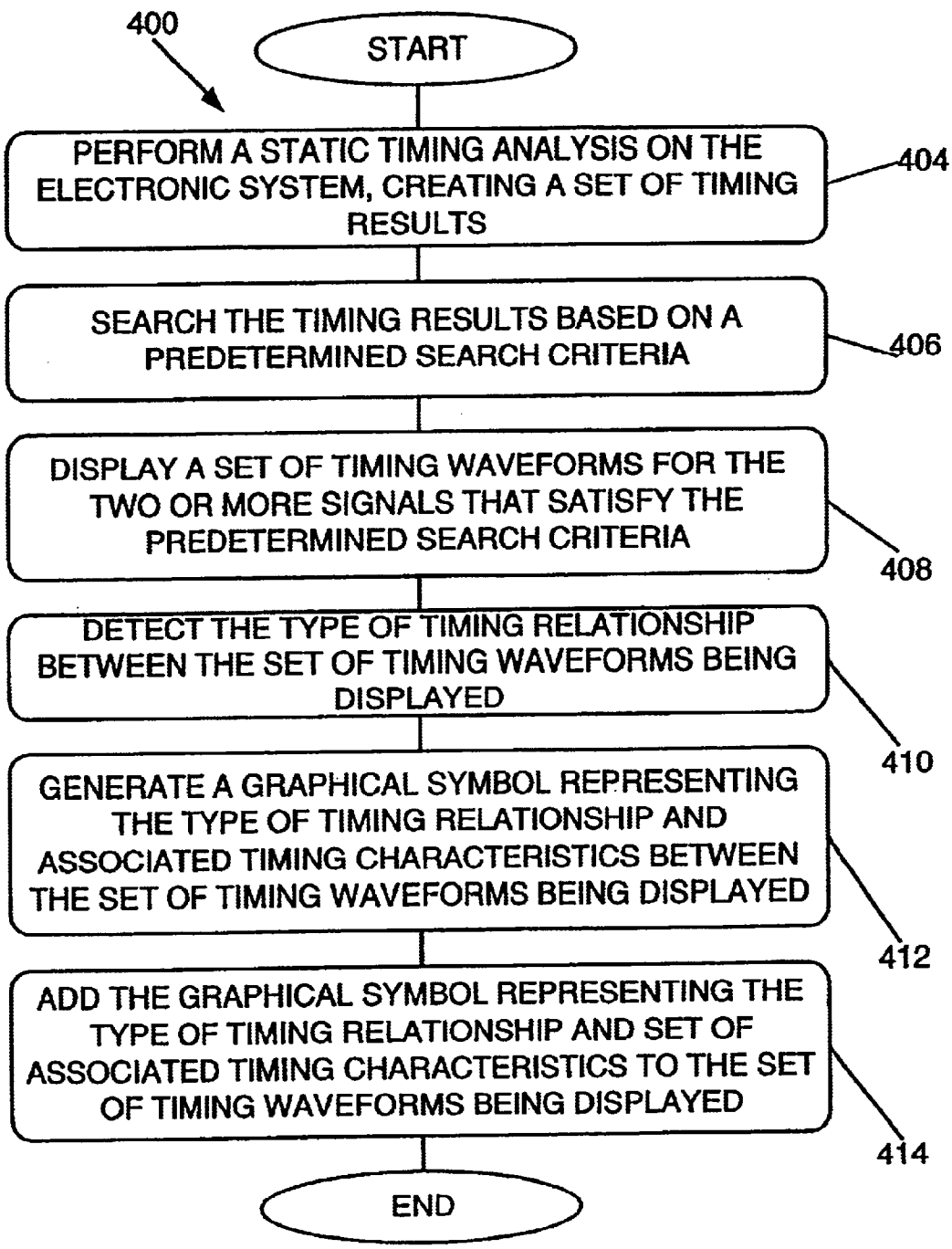
FIG. 4 illustrates a flow diagram showing an exemplary method for displaying timing relationships between two or more signals in an electronic system.

Moving now to FIG. 4, a flow diagram is illustrated at 400 showing an exemplary method for displaying timing relationships between two or more signals in an electronic system, in accordance with the present invention. The method begins at step 404, where a timing analysis is performed on an electronic design, creating a set of timing results. In a preferred embodiment, the timing analysis is a static timing analysis (STA).

Next, at step 406, the set of timing results is searched, based on a user supplied search criteria, for a set of signals that the design engineer would like to see in a graphical form at GUI waveform display 314. In one example, the design engineer may examine timing reports 312 to identify specific instances where the design failed to meet timing constraints. In this example, the designer would like to select the signal where the timing constraint is violated, and perhaps one or more signals that feed the violating signal.

After the search criteria have been supplied, the method next displays a set of timing waveforms at GUI waveform display 314 that satisfy the search criteria, as shown at block 408. Next, at block 410, the type of timing relationship between the set of timing waveforms being displayed is detected. In other words, the present invention goes beyond just detecting what signals feed other signals, and the amount of time that elapses between transitions between signals, as is done in current systems. The present invention "personalizes" the interrelationship between the signals being displayed, by determining the type of delay between signals.

At block 412, after the type of timing relationship has been detected, the present invention next generates a graphical symbol representing the type and characteristics of timing relationship between the set of timing waveforms being displayed. Unlike current systems, which just draw a line with an arrow between interrelated signals, the present invention chooses a symbol appropriate to the type and characteristics of the delay to link to interrelated signals. As an example, a wire delay symbol is used to link two displayed signals separated by a wire delay, and a component delay symbol is used to link two displayed signals separated by a component. In another example, if a setup/hold relationship exists between two displayed signals, a setup/hold symbol is generated which not only shows the amount of time required for the setup/hold requirement, but also the margin by which the setup/hold requirement has either not been met or has been exceeded. In this way, the graphical symbol not only represents the type of timing relationship between the displayed signals, but also any timing characteristics associated with the type of timing relationship between the displayed signals. It is contemplated that in alternative embodiments of the present invention, steps 408, 410 and 412 may be performed in any order, and still remain within the scope of the invention.

Finally, at block 414, the method adds the graphical symbol representing the type and characteristics of the timing relationship to the set of timing waveforms being displayed. In this way, the present invention interweaves and integrates the "logic" of the design within the timing representation.

FIG. 5A illustrates a simple electronic circuit. FIG. 5B (prior art) illustrates a conventional GUI waveform display of a failed setup condition at a latch within the electronic circuit of FIG. 5A. FIG. 5C illustrates a GUI waveform display of a failed setup condition at a latch within the electronic circuit of 5A, in accordance with the present invention.

The simple electronic circuit 500 of FIG. 5A includes a latch 502 having "DATA" and "CLK" inputs, an "AND" gate 504 having an output "G" feeding the "DATA" input of latch 502, and a clock signal 506 feeding the "CLK" input of latch 502. Circuit 500 further includes an inverter 508 having an output "E" feeding an input "F" of "AND" gate 504, and an inverter 510 having an output "C" feeding an input "D" of inverter 508. Finally, a source "A" feeds an input "B" of inverter 510.

The conventional GUI waveform display 520 of FIG. 5B illustrates a setup condition at latch 502, shown generally at 522. In the illustrated setup condition 522, a first signal ("DATA", in this example) is required to be valid (i.e., "stable") at a latch for some predetermined period of time before a second signal ("CLK", in this example) triggers it. In the illustrated example, the actual setup time is shown by an arrow extending from the clock transition 524 back to the time of the data transition 527. In some instances, a numerical value illustrating the actual setup time may be illustrated (not shown).

In addition to the "DATA" and "CLK" signals, GUI waveform display 520 includes waveforms for other various points in the circuit (e.g., "A", "B", "C", "D", "E", "F", and "G"). Thus, the design engineer may "trace back" the path of logic from the setup condition to the signal source, if desired.

While conventional GUI waveform display 520 is of value to the design engineer, several key pieces of information are missing which may be very desirable. For instance, while the actual setup condition 522 is shown, the margin by which the "DATA" signal meets or fails to meet the setup timing requirement is not shown. Also, while the signal points are shown for the "trace back" path of logic, there is no indication on the traceback arrows 526, what "type" of delay is between the signal points. Thus, a designer must consult an external source (e.g., a logic diagram) to determine the types of delay between signal points.

Turning now to FIG. 5C, a GUI waveform display 550 incorporating the features of the present invention is shown. The setup representation at latch 502 is shown generally at 552. Unlike the waveform display of FIG. 5B, this setup representation not only shows the actual setup time 552, but also the amount of time by which the "DATA" signal failed to meet the setup timing requirement 553.

While FIG. 5C displays the same set of signal points previously represented in FIG. 5B, this waveform display replaces the generic traceback arrows (FIG. 5B, 526) with symbols which graphically convey the type of delay present between the waveform signal points. For example, the signal wiring between output "G" of "AND" gate 504 and the "DATA" input of latch 502 is represented by a wire delay symbol 554. The delay across "AND" gate 504 (i.e., the transition between points "F" and "G") is represented by an "AND" gate symbol 556. The signal wire connecting output "E" of inverter 508 and input "F" of "AND" gate 504 is represented by a wire delay symbol 558. The delay across inverter 508 (i.e., the transition between points "D" and "E") is represented by an "inverting delay" symbol 560. The signal wire connecting output "C" of inverter 510 and input "D" of inverter 508 is represented by a wire delay symbol 562. The delay across inverter 510 (i.e., the transition between points "B" and "C") is represented by an inverter delay symbol 564. Finally, the wire delay between signal source "A" and input "B" of inverter 510 is represented by a wire delay symbol 566.

By providing the "type" and "characterization" of the delay between signal points, a designer can easily distinguish between wire delays and different types of block delays. With this information, the design engineer may be able to identify, for example, wire delays which are too great (e.g., caused by scenic wiring). This information will also enable the design engineer to easily identify block delays which are too great, perhaps caused by an underpowered logic block. In this manner, the presence of delay "types" on the diagram itself enable the design engineer to quickly see and understand the delay waveforms in a manner which is much more productive than the types of information conveyed in conventional timing diagrams.

Figure 6A:
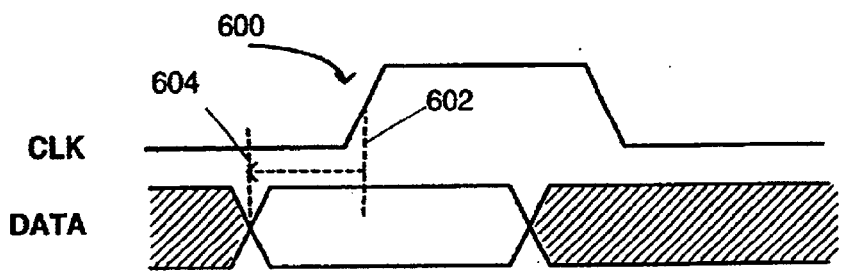
FIG. 6A illustrates a conventional way to display a graphical representation of a setup relationship between two signals in a GUI waveform display.
Figure 6B:
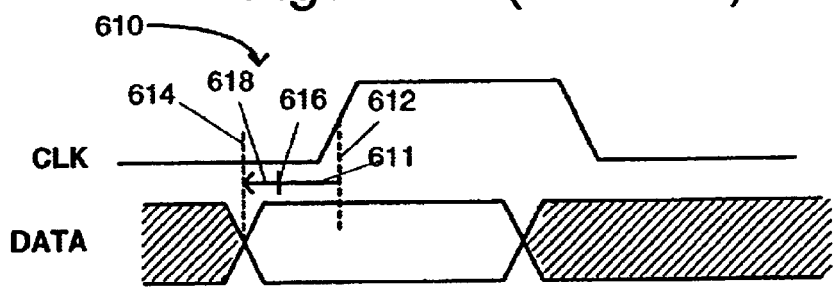
FIGS. 6B, 6C and 6D illustrate three different setup scenarios between two signals, and how the present invention graphically represents each scenario.
Figure 6C:
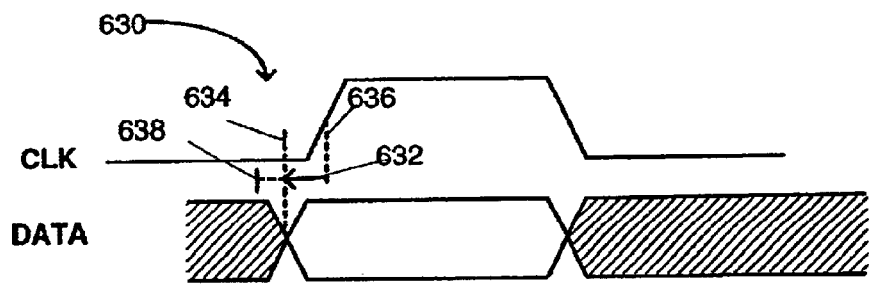
Figure 6D:
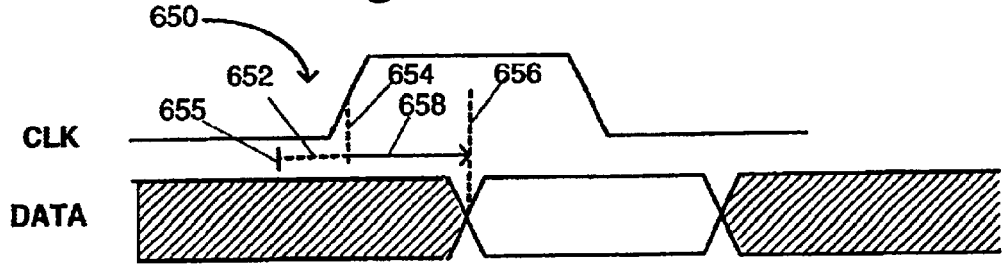

As described earlier, in order to satisfy a setup condition, a first signal ("DATA", in this example) is required to be valid (i.e., "stable") at a latch for some period of time before a second signal ("CLK", in this example) latches it. FIG. 6A illustrates a conventional way to display a graphical representation of a setup relationship in a GUI waveform display. FIGS. 6B, 6C and 6D illustrate three different setup scenarios, and how the present invention graphically represents each scenario. In the conventional setup scenario of FIG. 6A, shown generally at 600, the actual setup time is shown by an arrow extending from the clock transition 602 back to the time of the data transition 604.

In the first setup scenario of the present invention, shown generally at 610 of FIG. 6B, a setup relationship is illustrated which satisfies the given setup requirement. In this scenario, the required setup time is illustrated by a line 611 extending from a clock transition 612 back toward a data transition 614, with a perpendicular line 616 marking the minimum setup requirement. Thus, the amount of time by which the data remains stable beyond the minimum setup requirement is indicated by the portion of line 611 which extends to the left of the perpendicular line 616 (shown generally at 618) back toward the data transition 614.

In the second setup scenario of the present invention, shown generally at 630 of FIG. 6C, a setup relationship is illustrated which fails to satisfy the given setup requirement. In this scenario, the actual setup time is illustrated by the entirety of the line represented at 632. However, in this scenario, the data transition 634 occurs too close to clock transition 632. In this instance, this shortfall is indicated by a dashed line that extends between the data transition, and the line marking the minimum setup time requirement 638. The total required setup time is represented by the sum of both line segments, the actual setup time 632 and the shortfall time between 634 and 638.

In the third setup scenario of the present invention, shown generally at 650 of FIG. 6D, a setup relationship is illustrated which fails to satisfy the given setup requirement, because the data actually arrives after the clock transition. In this scenario, the minimum required setup time 655 is illustrated by the dashed line segment extending to the left from the clock transition 654, as shown at 652. A solid line segment extends to the right from the clock transition 654 to the data transition 656, as shown generally at 658. Thus, in this scenario, the amount by which the data transition missed the required setup margin is illustrated by the combination of the solid line segment 658 and the dashed line segment 652.

Figure 7A:
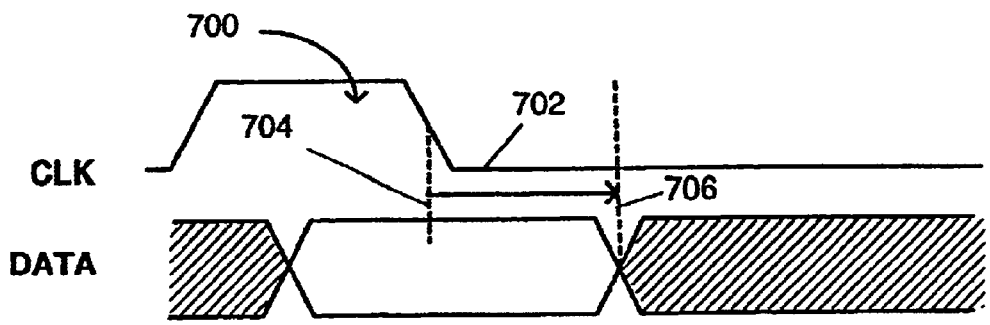
FIG. 7A illustrates a conventional way to display a graphical representation of a hold relationship between two signals in a GUI waveform display.
Figure 7B:
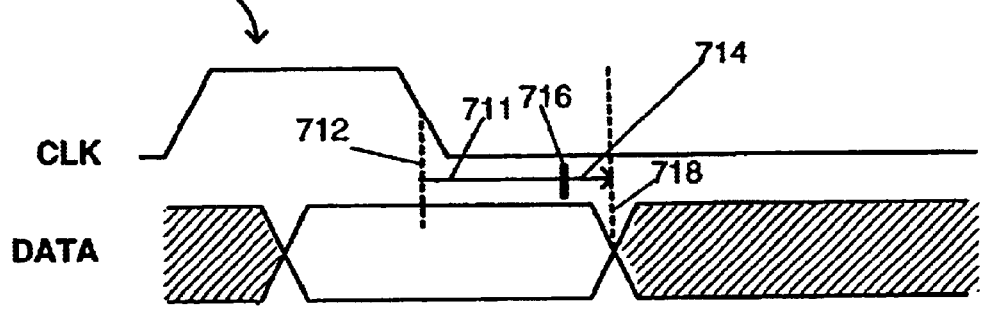
FIGS. 7B, 7C and 7D illustrate three different hold scenarios between two signals, and how the present invention graphically represents each scenario.
Figure 7C:
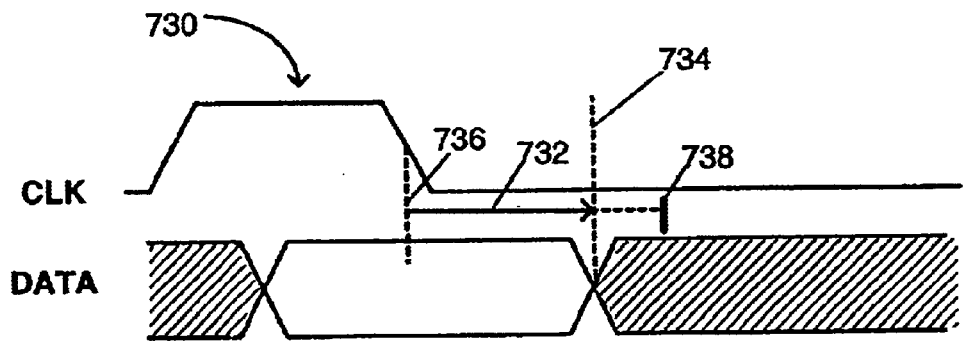
Figure 7D:
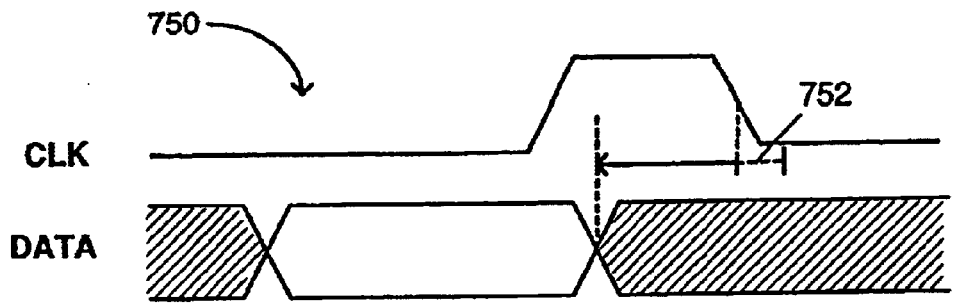

In order to satisfy a hold condition, a first signal ("DATA", in this example) is required to be valid (i.e., "stable") at a latch for some period of time after a second signal ("CLK", in this example) captures it. FIG. 7A illustrates a conventional way to display a graphical representation of a hold type relationship in a GUI waveform display. FIGS. 7B, 7C and 7D illustrate three different hold type scenarios, and how the present invention graphically represents each scenario. In the conventional hold representation of FIG. 7A, shown generally at 700, the actual hold time is shown by an arrow 702 extending from the clock transition 704 forward to the time of the data transition 706.

In the first setup scenario of the present invention, shown generally at 710 of FIG. 7B, a hold relationship is illustrated which satisfies the given hold requirement. In this scenario, the actual hold time is illustrated by a line 711 extending from a clock transition 712 forward toward a data transition 718, with a perpendicular line 716 marking the minimum hold time requirement. Thus, the amount of time by which the data remains stable beyond the minimum setup requirement is indicated by the portion of line 711 which extends to the right of perpendicular line 716 (shown generally at 714) forward toward data transition 718.

In the second hold scenario of the present invention, shown generally at 730 of FIG. 7C, a hold relationship is illustrated which fails to satisfy the given hold requirement. In this scenario, the required hold time is illustrated by the entirety of the line represented at 732 (i.e., both solid and dashed line segments). However, in this scenario, the data transition 734 occurs too close to the clock transition 736. In this instance, this shortfall is indicated by a dashed line that extends to the right between the data transition 734, and the line marking the minimum hold time requirement 738.

In the third hold scenario of the present invention, shown generally at 750 of FIG. 7D, a hold relationship is illustrated which fails to satisfy the given hold requirement, because the data changes before the clock transition. In this scenario, the minimum required hold time is illustrated by the dashed line segment extending to the right from the clock transition 756, as shown at 752.

Figure 8A:
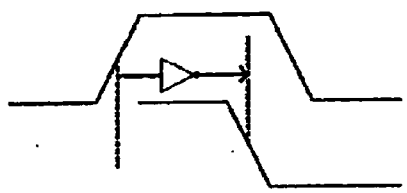
FIGS. 8A–8J illustrate examples of various types of delays symbols that are utilized within the present invention to represent corresponding delay types in the waveform display.
Figure 8F:
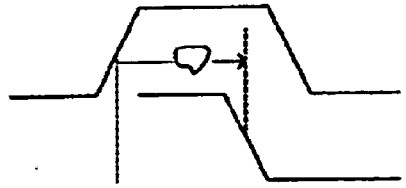
Figure 8B:
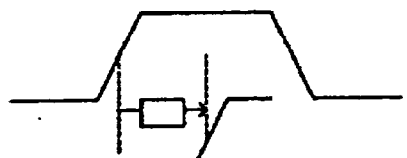
Figure 8G:
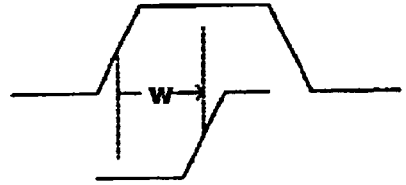
Figure 8C:
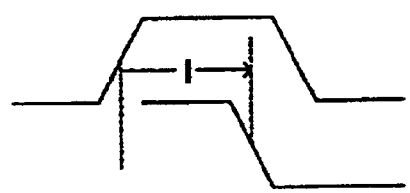
Figure 8H:
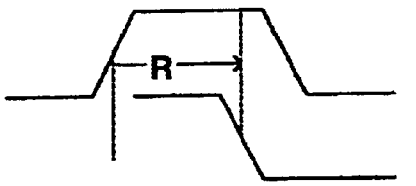
Figure 8D:
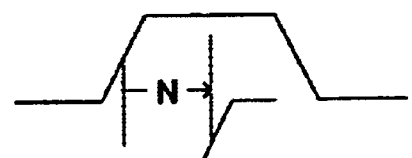
Figure 8I:
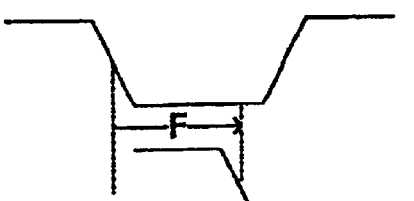
Figure 8E:
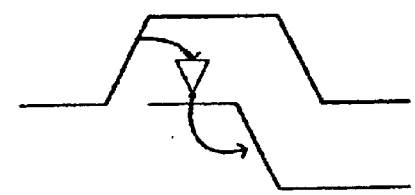
Figure 8J:
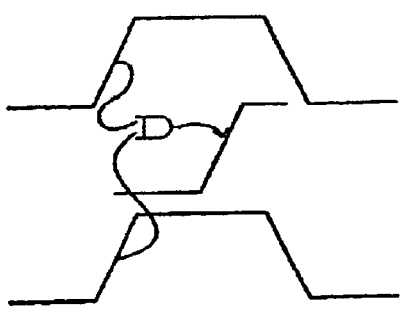

FIGS. 8A–8J illustrate examples of various types of delay symbols that are utilized within the present invention to represent corresponding delay types in the GUI waveform display. FIGS. 8A (inverter delay), 8C (inverting delay), and 8E (inverter delay) all symbolically represent one or more logic components which invert the logic state of a first signal at a second signal after some amount of delay. FIGS. 8B (block delay), and 8D (non-inverting delay) symbolically represent one or more logic components which propagate the transition from a first logic signal to a second logic signal after some amount of delay. FIG. 8F symbolically represents a combinational logic delay as a "cloud of logic" which can be expanded or collapsed to show actual gate level logic via user selection. The combinational logic delay is discussed in further detail in FIGS. 9A and 9B. FIG. 8G symbolically represents a wire delay between two signal traces in a waveform display. FIGS. 8H and 8I symbolically represent rise and fall triggered delays, respectively. Finally, FIG. 8J symbolically represents an "AND-gate" type delay where the rising/falling edges of two or more signal traces cause a transition in an output signal trace after some amount of delay.

The symbols illustrated in FIGS. 8A–8J are examples of symbols that may be employed to represent types of delays within electronic systems. However, it is contemplated that a wide variety of alternative symbols/delay types may be employed and still remain within the spirit and scope of the present invention.

Figure 9A:
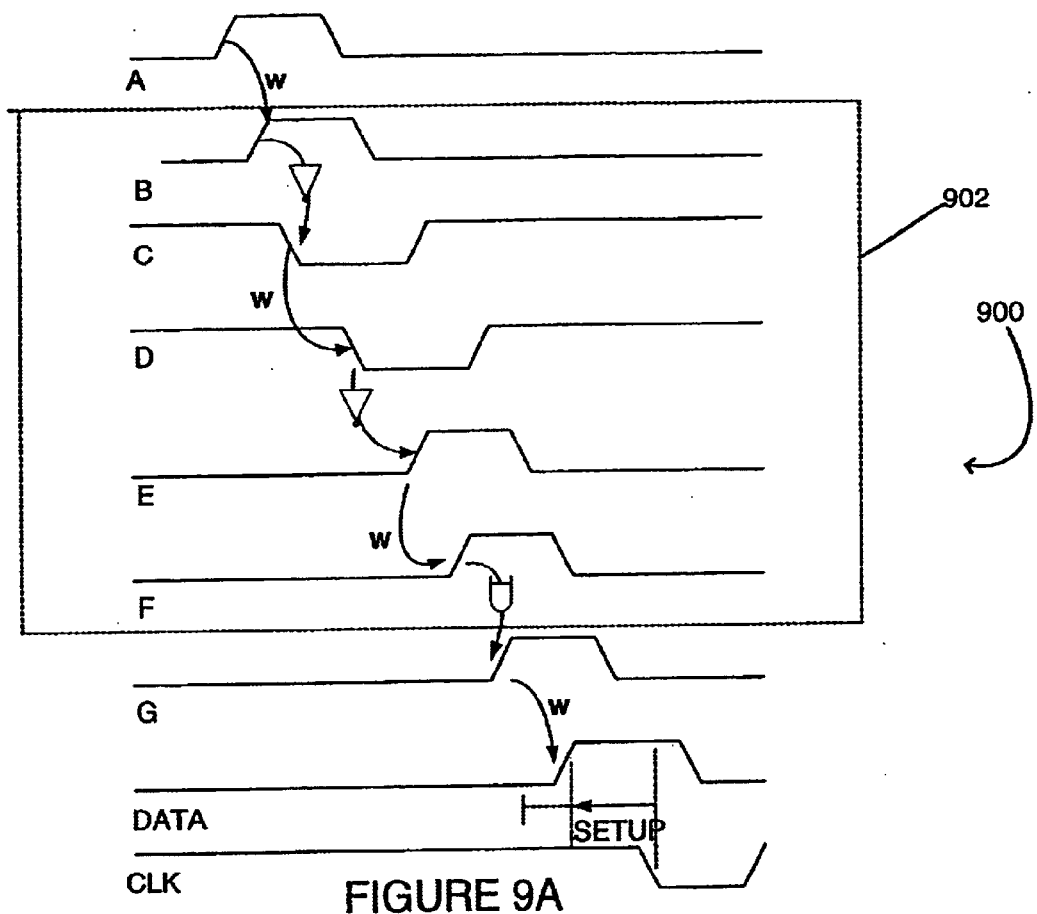
FIG. 9A illustrates a GUI waveform display having a number of signal traces, and symbols interconnecting the signal traces indicating the type of delay present between the signals.

FIG. 9A illustrates a GUI waveform display having a number of signal traces, and symbols interconnecting the signal traces indicating the type of delay present between the signals, shown generally at 900. In one instance, the design engineer might find that a number of waveforms currently displayed on the screen are not particularly interesting or that they are cluttering. In another instance, the number of signals involved in a trace back from a register might be too numerous to all fit on a single screen. In order to alleviate these problems, the present invention provides a "cloud of logic feature, which enables a design engineer to select two or more signals to collapse into a combinational logic delay (i.e., cloud of logic) symbol (previously illustrated in FIG. 8F), thus reducing the number of signals displayed on the screen. In the illustrated embodiment, a design engineer selects one or more waveforms/symbols to collapse by drawing a box around the selected waveform/symbols, as shown at 902, then activating the collapse feature. It is contemplated that a variety of alternative methods may be employed to select the one or more waveforms/symbols to collapse.

Figure 9B:
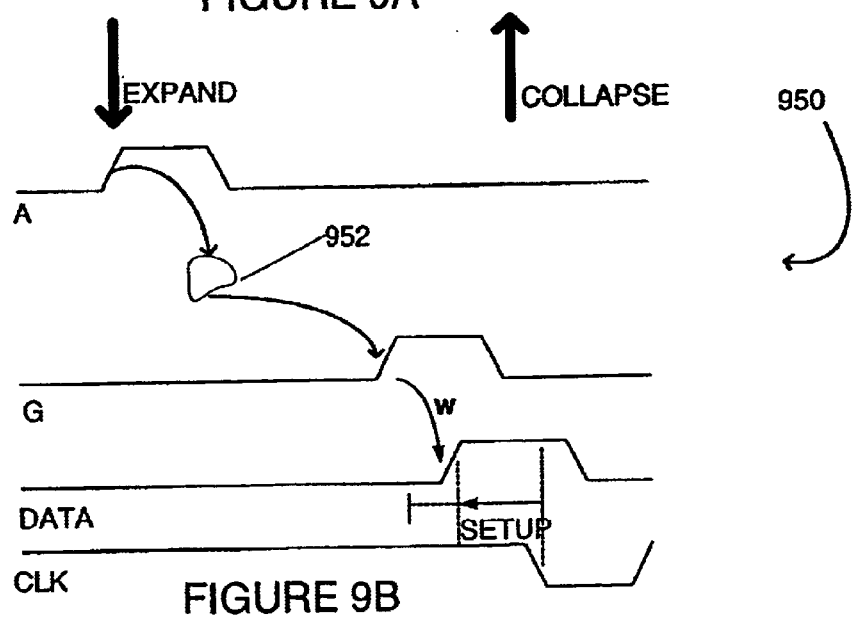
FIG. 9B illustrates the GUI waveform display of FIG. 9A, where the selected waveforms/symbols have been collapsed and replaced by the combinational logic delay symbol, in accordance with the present invention.

FIG. 9B illustrates the GUI waveform display of FIG. 9A, where the selected waveforms/symbols have been collapsed and replaced by the combinational logic delay symbol 952 (i.e., the "cloud of logic" symbol), shown generally at 950. If a user wishes to once again see the specific waveforms/symbols represented by the combinational logic delay symbol, the design engineer simply has to select the symbol, and activate an "expand" feature, which will then redisplay the waveforms/symbols, as shown in FIG. 9A.

Additional modifications may be made to the illustrated embodiments without departing from the spirit or scope of the invention. Therefore, the invention lies in the claims hereinafter appended.

What is claimed is:

1. A method for displaying timing relationships between two or more signals in an electronic system, the method comprising the steps of:
    performing a timing analysis on the electronic system, creating a set of timing results;
    searching the set of timing results based on a predetermined search criteria;
    displaying a set of timing waveforms for the two or more signals that satisfy the predetermined search criteria;
    detecting a type of timing relationship between the set of timing waveforms being displayed;
    generating a graphical symbol representing the type of timing relationship and associated timing characteristics between the set of timing waveforms being displayed; and
    adding the graphical symbol representing the type of timing relationship and associated timing characteristics to the set of timing waveforms being displayed.

2. The method of claim 1, wherein the timing analysis is a static timing analysis (STA).

3. The method of claim 1, wherein the associated timing characteristics include timing margin requirements.

4. The method of claim 1, wherein the type of timing relationship is a setup relationship.

5. The method of claim 4, wherein the graphical symbol representing the setup relationship includes a graphical indication of the amount of time by which a signal chosen from the two or more signals either satisfies or violates the setup time requirement.

6. The method of claim 1, wherein the type of timing relationship is a hold relationship.

7. The method of claim 6, wherein the graphical symbol representing the hold relationship includes a graphical indication of the amount of time by which a signal chosen from the two or more signals either satisfies or violates the hold time requirement.

8. The method of claim 1, wherein the type of timing relationship is a block delay relationship.

9. The method of claim 8, wherein the graphical symbol representing the block delay relationship is a block delay symbol.

10. The method of claim 8, wherein the block delay relationship is an inverting delay, and the graphical symbol representing the inverting delay relationship is an inverting delay symbol.

11. The method of claim 8, wherein the block delay relationship is a non-inverting delay, and the graphical symbol representing the non-inverting delay relationship is a non-inverting delay symbol.

12. The method of claim 8, wherein the block delay relationship is a combinational logic delay, and the graphical symbol representing the combinational logic delay relationship is a combinational logic delay symbol.

13. The method of claim 12, wherein the combinational logic delay symbol can expanded into one or more delay type components.

14. The method of claim 13 wherein one or more delay type components can be selected and collapsed into a combinational logic delay symbol on the display.

15. The method of claim 1, wherein the type of timing relationship is a wire delay relationship, and the graphical symbol representing the wire delay relationship is a wire delay symbol.

16. The method of claim 1, wherein the type of timing relationship is a rise-triggered delay relationship, and the graphical symbol representing the rise-triggered delay relationship is a rise-triggered delay symbol.

17. The method of claim 1, wherein the type of timing relationship is a fall-triggered delay relationship, and the graphical symbol representing the fall-triggered delay relationship is a fall-triggered delay symbol.

18. A computer readable medium storing a software program that, when executed by a processor, causes the processor to perform a method for displaying timing relationships between two or more signals in an electronic system, the method comprising the steps of:
    performing a timing analysis on the electronic system, creating a set of timing results; searching the set of timing results based on a predetermined search criteria;
    displaying a set of timing waveforms for the two or more signals that satisfy the predetermined search criteria;
    detecting a type of timing relationship between the set of timing waveforms being displayed;
    generating a graphical symbol representing the type of timing relationship and associated timing characteristics between the set of timing waveforms being displayed; and
    adding the graphical symbol representing the type of timing relationship and associated timing characteristics to the set of timing waveforms being displayed.

19. The computer readable medium of claim 18, wherein the associated timing characteristics include timing margin requirements.

20. The computer readable medium of claim 18, wherein the type of timing relationship is a setup relationship.

21. The computer readable medium of claim 20, wherein the graphical symbol representing the setup relationship includes a graphical indication of the amount of time by which a signal chosen from the two or more signals either satisfies or violates the setup time requirement.

22. The computer readable medium of claim 18, wherein the type of timing relationship is a hold relationship.

23. The computer readable medium of claim 22, wherein the graphical symbol representing the hold relationship includes a graphical indication of the amount of time by which a signal chosen from the two or more signals either satisfies or violates the hold time requirement.

24. The computer readable medium of claim 18, wherein the type of timing relationship is a block delay relationship.

25. The computer readable medium of claim 24, wherein the graphical symbol representing the block delay relationship is a block delay symbol.

26. The computer readable medium of claim 24, wherein the block delay relationship is a combinational logic delay, and the graphical symbol representing the combinational delay relationship is a combinational logic delay symbol.

27. The computer readable medium of claim 26, wherein the combinational logic delay symbol can expanded into one or more delay type components.

28. The computer readable medium of claim 27, wherein one or more delay type components can be selected and collapsed into a combinational logic delay symbol on the display.

29. The computer readable medium of claim 18, wherein the type of timing relationship is a wire delay relationship, and the graphical symbol representing the wire delay relationship is a wire delay symbol.

30. The computer readable medium of claim 18, wherein the timing analysis is a static timing analysis (STA).

* * * * *